(12) United States Patent
Quan et al.

(10) Patent No.: US 8,921,126 B2
(45) Date of Patent: Dec. 30, 2014

(54) MAGNETIC SEED METHOD FOR IMPROVING BLOCKING TEMPERATURE AND SHIELD TO SHIELD SPACING IN A TMR SENSOR

(71) Applicant: Headway Technologies, Inc., Milpitas, CA (US)

(72) Inventors: Junjie Quan, Milpitas, CA (US); Kunliang Zhang, Fremont, CA (US); Min Li, Fremont, CA (US); Hui-Chuan Wang, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/750,401

(22) Filed: Jan. 25, 2013

(65) Prior Publication Data

US 2014/0210022 A1 Jul. 31, 2014

(51) Int. Cl.
*H01L 21/00* (2006.01)

(52) U.S. Cl.
USPC ....... 438/3; 438/133; 360/324.11; 360/324.2; 257/53; 257/295; 257/421

(58) Field of Classification Search
CPC .... G11B 5/3906; G11B 5/3909; B82B 10/00; H01F 10/3272; G01R 33/093
USPC .................. 257/295, 421, E27.006, E29.323; 438/3; 360/324.11, 324.2, 319
See application file for complete search history.

(56) References Cited

U.S. PATENT DOCUMENTS

| 8,164,862 | B2 | 4/2012 | Zhang et al. |
| 8,230,583 | B2 | 7/2012 | Lille |
| 2005/0052789 | A1 | 3/2005 | Zhang et al. |
| 2009/0174968 | A1 | 7/2009 | Singleton et al. |
| 2009/0251829 | A1 | 10/2009 | Zhang et al. |

*Primary Examiner* — Dung A. Le
(74) *Attorney, Agent, or Firm* — Saile Ackerman LLC; Stephen B. Ackerman; Rosemary L. S. Pike

(57) ABSTRACT

A process for manufacturing a TMR sensor is disclosed wherein the blocking temperature of the AFM layer in the TMR sensor has been raised by inserting a magnetic seed layer between the AFM layer and the bottom shield. This gives the device improved thermal stability, including improved SNR and BER.

9 Claims, 2 Drawing Sheets

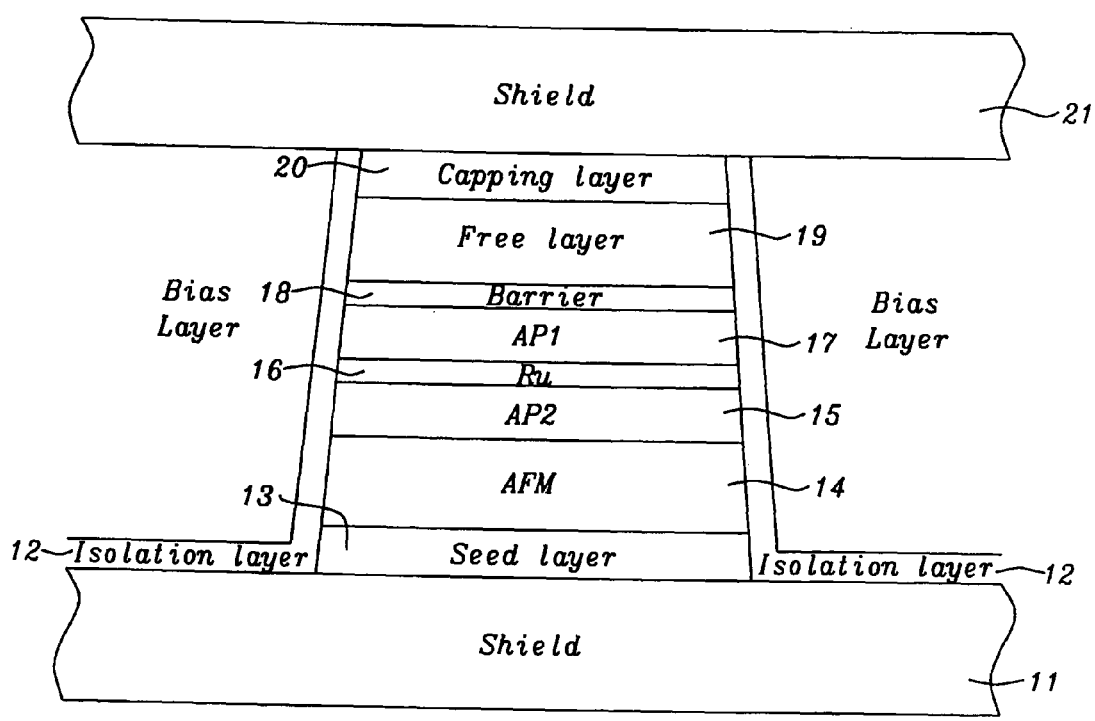
FIG. 1 – Prior Art

MAGNETIC SEED METHOD FOR IMPROVING BLOCKING TEMPERATURE AND SHIELD TO SHIELD SPACING IN A TMR SENSOR

TECHNICAL FIELD

This application relates to the general field of magnetic sensors with particular reference to tunneling magneto-resistive (TMR) sensors and how to reduce high temperature noise.

BACKGROUND

A conventional TMR sensor includes a seed layer, an anti-ferromagnetic (AFM) layer having a blocking temperature $T_b$, synthetic anti-parallel (SyAP) layers, one of which serves as the reference layer, a barrier layer, a free layer, and one or more capping layers. As TMR sensors become smaller, sensor noise improvement, especially at high temperatures, is critical for maintaining or improving the signal to noise ratio (SNR) and the bit error ratio (BER) (the number of bit errors divided by the total number of transferred bits).

A Ta based seed layer, such as Ta/Ru, Ta/Cr, Ta/Cu or Ta/NiCr, is usually used as the seed layer for a TMR sensor but it is very difficult to improve the thermal stability of such seeds without increasing AFM and/or seed thickness. This leads to an increase in shield-to-shield spacing, resulting in a resolution penalty.

FIG. 1 shows a TMR sensor of the prior art. Depicted there are bottom and top shields, 11 and 21 respectively, conventional seed layer 13 (ranging in thickness from 5 Å to 30 Å), AFM layer 14 (ranging in thickness from 50 Å to 100 Å), antiparallel (AP)2 layer 15, AP coupling layer 16 (usually of ruthenium), and AP1 (ranging from 10 Å to 40 Å), the latter also serving as the reference layer. AP1 is followed by insulated tunnel barrier layer 18 on which lies free layer 19 followed by capping layer(s) 20.

SUMMARY

It has been an object of at least one embodiment of the present disclosure to raise the blocking temperature of a TMR sensor's AFM layer, thereby improving its thermal stability.

Another object of at least one embodiment of the present disclosure has been to reduce shield to shield spacing thereby achieving better spatial resolution.

Still another object of at least one embodiment of the present disclosure has been to provide a process for manufacturing the disclosed TMR sensor.

A still further object of at least one embodiment of the present disclosure has been for the above process to be fully compatible with currently used processes.

These objects have been achieved by inserting a magnetic seed layer, between the AFM layer and the bottom shield layer. The first seed layer can be magnetic or non-magnetic, This raises the blocking temperature of the AFM layer, improving high temperature noise, including improved SNR and BER.

BRIEF DESCRIPTION OF THE DRAWINGS

FIG. 1. Schematic drawing of conventional TMR sensor

DETAILED DESCRIPTION

Better thermal stability with much higher blocking temperature has been achieved by inserting a NiFeX based layer between the bottom shield and the AFM layer. Examples of NiFeX materials include, but are not limited to, NiFe, NiFeCr, NiFeW, NiFeRh, NiFeTa, NiFeMo, NiFeHf, NiFeNb, NiFeZr, NiFeTi and NiFeCo. This improvement in the thermal properties is achieved without degrading the sensor properties.

We disclose below how the blocking temperature of a TMR device is improved by replacing the conventional (non-magnetic) seed layer with a NiFeX based magnetic seed. The NiFeX based magnetic seed provides a better substrate on which to grow the AFM layer by enhancing the AFM crystal orientation.

The magnetic seed can also serve as a shield for the TMR sensor so, by removing the non-magnetic seed layer, the shield-to-shield spacing can be decreased.

Figure 2A:
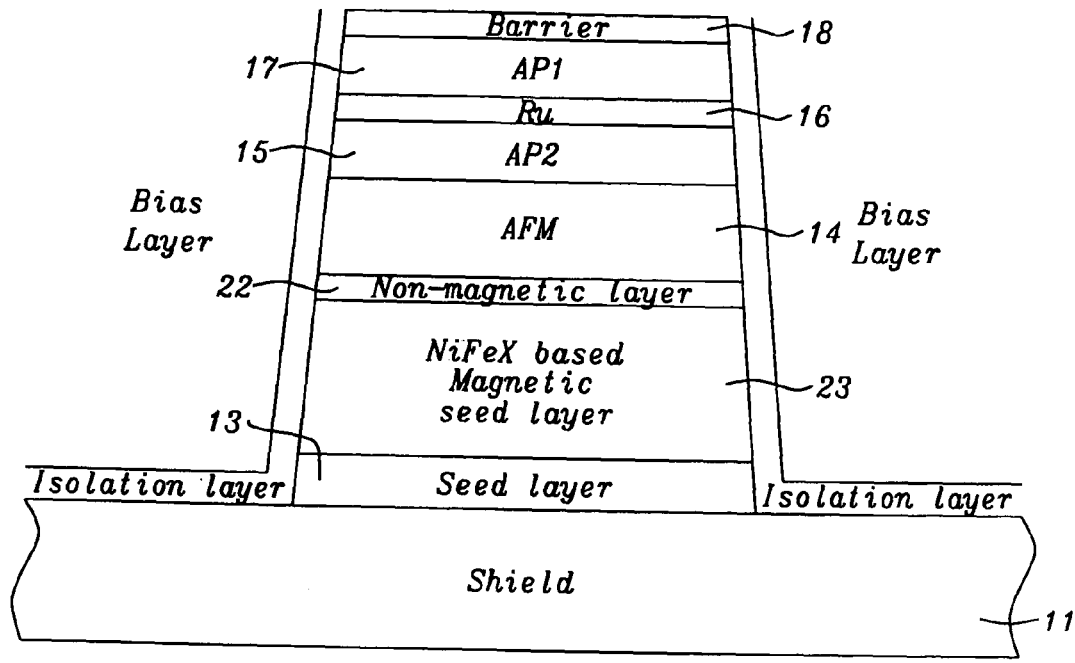
FIG. 2a. Schematic drawing of a first embodiment of the disclosed TMR sensor with a magnetic seed layer inserted to be part of the stack FIG. 2b. Schematic drawing of a second embodiment of the disclosed TMR sensor with a magnetic seed layer inserted as part of the shield structure
Figure 2B:
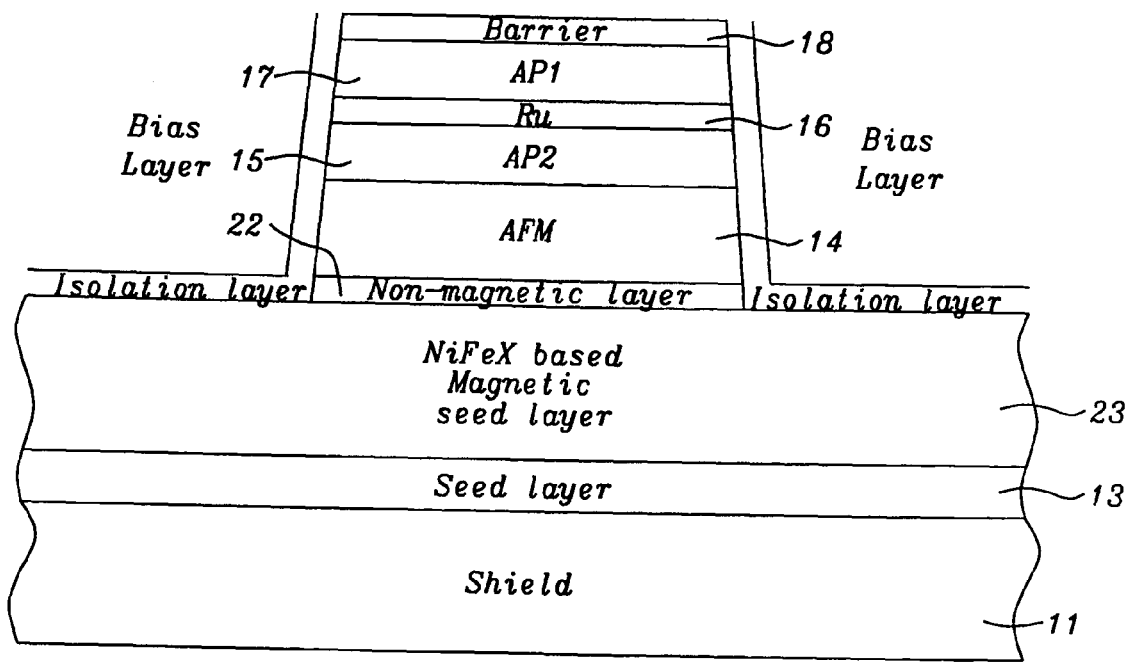

FIGS. 2a and 2b disclose two configurations that we have used to improve the Tb of a TMR sensor when NiFeX based magnetic seed layers replace conventional non-magnetic seed layers.

First seed layer 13 (which can be magnetic or non-magnetic) of an amorphous or fine-grained material is deposited first (on lower shield 11) to reduce/eliminate crystallographic influence of an underlying NiFe shield layer. The first seed layer ranges in thickness from 5 to 30 Å and includes, but is not limited to, Ta, CoFeB, CoFeZr, CoNiFeZr, CoFeHf, CoNiFeHf, CoFeTa, CoFeNiTa, CoFeNbZr and FeTa.

NiFeX type magnetic seed layers 23 are then deposited to provide the template for AFM growth (to a thickness in the of 20 to 200 Å range). Non-magnetic layer 22, such as Ru, Cr, Cu, Al, NiFeCr or NiCr, is then deposited on magnetic seed layer 23 (to a thickness in a range of 5 to 20 Å) followed by the deposition (on non-magnetic layer 22) of AFM layer 14. Note that non-magnetic layer 22 serves to eliminate exchange coupling between the AFM layer and the magnetic seed layer Also shown, though not part of the invention, are isolation layers 12 and the locations of the longitudinal bias layers.

Together with the device's magnetic first seed layer, magnetic seed layer 23 will be magnetically coupled to bottom shield 11, thereby acting as a shield itself, which reduces shield to shield spacing of the TMR sensor. For a thin non-magnetic first seed layer less than 10 Å thick, magnetostatic coupling between magnetic seed and bottom shield will reduce the effective shield to shield spacing of a TMR sensor.

The NiFeX based seed layer can be a single layer or a multi-layer, provided at least one of its NiFeX layers contains at least 40 atomic percent of Fe. Different compositions of NiFeX layers (including combination with CoFeX) can be used in the multilayer configurations in order to optimize the magnetic properties (including magnetostriction) of the magnetic seed layer. CoFeX examples include, but are not limited to, CoFe, CoFeB, CoFeNb and CoFeNi. Also, the smoothness of the magnetic seed surface is usually improved with a multilayer configuration, which provides a better template to grow the TMR sensors.

FIGS. 2(a) and 2(b) show examples of two different milling depths—(a) leaving only the bottom shield unmilled and (b) terminating milling just before the NiFeX magnetic seed layer is reached. The milling depth that is selected is a matter of designer choice, usually dictated by the needs of the bias layers. For example, with the magnetic seed layer the blocking temperature of the sensor can be improved to be as high as 40 degrees, which provides advantages for thermal stability.

X-ray diffraction analysis showed that the NiFeX magnetic seed enhanced AFM crystallographic orientation, which is important for improved thermal stability.

What is claimed is:

1. A method to increase thermal stability of a TMR sensor that includes, on a first seed layer, an antiferromagnetic (AFM) layer having a blocking temperature, comprising:
   inserting, between said AFM layer and said first seed layer, a NiFeX based magnetic seed layer containing at least 40 atomic percent of Fe;
   inserting between said magnetic seed layer and said AFM layer a non-magnetic layer, of sufficient thickness of 5 to 20 Angstroms to prevent exchange coupling between said AFM layer and said magnetic seed layer; and
   thereby raising said blocking temperature to be in a range of from 10 to 40° C.

2. The method recited in claim 1 wherein said magnetic seed layer is selected from the group consisting of NiFe, NiFeCr, NiFeW, NiFeRh, NiFeTa, NiFeMo, NiFeHf, NiFeNb, NiFeZr, NiFeTi, and NiFeCo.

3. The method recited in claim 1 wherein said non-magnetic layer is selected from the group consisting of Ru, Cr, Cu, Al, NiFeCr, and NiCr.

4. A process to manufacture a TMR sensor that has high thermal stability, comprising:
   providing a lower magnetic shield and depositing thereon a first seed layer to reduce any crystallographic influence by said lower magnetic shield;
   depositing on said first seed layer a NiFeX type magnetic seed layer containing at least 40 atomic percent of Fe;
   depositing a non-magnetic layer on said magnetic seed layer;
   depositing an antiferromagnetic (AFM) layer on, and contacting, said non-magnetic layer; and
   then depositing, in succession, a synthetic antiferromagnetic trilayer, a tunnel barrier layer, a free layer, a capping layer, and a top magnetic shield layer, thereby completing formation of said TMR sensor.

5. The process recited in claim 4 wherein said magnetic seed layer is selected from the group consisting of NiFe, NiFeCr, NiFeW, NiFeRh, NiFeTa, NiFeMo, NiFeHf, NiFeNb, NiFeZr, NiFeTi, and NiFeCo.

6. The process recited in claim 4 further comprising shaping a part of said TMR sensor into a conical stack by ion milling said TMR sensor as far as said NiFeX magnetic seed layer.

7. The process recited in claim 6 further comprising continuing ion milling until only said bottom shield remains unmilled.

8. The process recited in claim 4 wherein said NiFeX magnetic seed is multilayered, has a total thickness in a range of from 20 to 200 Å and includes at least one NiFeX layer that contains at least 40 atomic percent of Fe.

9. The process recited in claim 8 wherein at least one layer is selected from the group consisting of CoFe, CoFeB, CoFeNb and CoFeNi is included in said multi-layered magnetic seed.

* * * * *